(12) United States Patent
Kang

(10) Patent No.: US 7,389,483 B2
(45) Date of Patent: Jun. 17, 2008

(54) METHOD FOR AUTO ENLARGING BEND PORTION WIDTH AND COMPUTER READABLE RECORDING MEDIUM FOR STORING PROGRAM THEREOF

(75) Inventor: Szu-Sheng Kang, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 253 days.

(21) Appl. No.: 11/160,390

(22) Filed: Jun. 22, 2005

(65) Prior Publication Data

US 2006/0294484 A1 Dec. 28, 2006

(51) Int. Cl.
*G06F 17/50* (2006.01)

(52) U.S. Cl. ............................................. 716/9; 716/10
(58) Field of Classification Search ................ 716/8–12
See application file for complete search history.

(56) References Cited

U.S. PATENT DOCUMENTS 5,490,084 A * 2/1996 Okubo et al. .................. 716/4
6,449,758 B1 * 9/2002 Satoh et al. ................... 716/10
6,779,167 B2 * 8/2004 Igarashi et al. ............... 716/13
2002/0023254 A1 * 2/2002 Liao et al. ...................... 716/8

* cited by examiner

Primary Examiner—Jack Chiang
Assistant Examiner—Binh Tat
(74) Attorney, Agent, or Firm—Winston Hsu

(57) ABSTRACT

A method for auto enlarging bend portion width and a computer readable recording medium for storing program thereof are provided. The method can enlarge the bend portion width from an original width to an intended width in layout. Wherein, the terminals of the center line of the bend is a first turn point and a second turn point, respectively. The method includes following steps. First calculating the original width, the intended width, the coordinates of the first turn point and the second turn point to obtain a plurality coordinates of the corner-points of the polygon. Wherein, the width of the polygon is the intended width. Then add the polygon into the original layout.

36 Claims, 10 Drawing Sheets

METHOD FOR AUTO ENLARGING BEND PORTION WIDTH AND COMPUTER READABLE RECORDING MEDIUM FOR STORING PROGRAM THEREOF

BACKGROUND OF THE INVENTION

1. Field of Invention

The present invention relates to a method of electric circuit layout, and particularly to automatic enlarging width of bend portion, and computer readable recording medium for storing program with aforesaid method.

2. Prior Art

In electric circuit layout, it is needed to implement a plurality of longitudinal and latitudinal circuit lines (leads) to obtain electric connection between the devices. Generally, aforesaid longitudinal and latitudinal electric lines interconnect by 90 degree angle. In considering on some electric characteristics or electric circuit area, a bend portion is usually needed to be implemented in the electric circuit sometimes. For example, in an integrated circuit, a gate electrode of transistor is designed to be a circuit line with 45 degree bending for saving electric circuit area.

FIG. 1 is a top view, schematically illustrating a conventional transistor which has a gate electrode with bend portion by 45 degrees. Referring to FIG. 1, the gate line 120 of the transistor 100 is designed to have 45-degree bend portion 121, then the source contact window 110 and the drain contact window 130 are respectively implemented at two sides of the bend portion 121. Therefore, the area of the transistor 120 can be significantly reduced.

However, during forming the gate line 120 with a line width W0, it is often that the edge of the bend portion 121 is over etched due to processing effect. As a result, the line width of the bend portion 121 is reduced to W1. If the line width W0 is large enough, the influence of over etching is limited (W1 is approximate to W0), thus, characteristic of the transistor 100 (ratio of length to width of the channel) has no change almost. But, when more an advanced process (for example, process with line width smaller than 0.25 microns) is used to fabricate the transistor 100, because the line width W0 is thinner, the difference between W0 and W1 cannot be ignored. In order to ensure the ratio of length to width for the channel of the designed transistor 100, a conventional method is to pre-enlarge the line width of the bend portion 121 to W2.

In the present practice, after circuit layout is finished by using the tool of electronic design automation, the 45 degree bend portion is manually searched one by one, and then the electronic design automation tools are manually manipulated to pull each edge of the 45 degree bend portion outward to be wider. Hence, in order to enlarge the line width of the 45 degree bend portion, often, much time is spent on circuit layout modification in layout engineering.

SUMMARY OF THE INVENTION

An objective of the present invention is to provide a method for automatically enlarging the width of the bend portion, the method can enlarge the width of the bend portion automatically without manual operation. The efficiency of layout can be improved.

Another objective of the present invention is to provide a computer readable recording medium for storing a program for the foregoing intended.

The present invention provides a method for automatically enlarging a width of a bend portion. The method can enlarge the width of the bend portion from an original width to an intended width in layout. The terminals of the center line of the bend portion are a first turn point and a second turn point, respectively. The method includes following steps. First, the original width, the intended width, the coordinates of the first turn point and the second turn point are used in calculation to obtain a plurality coordinates of the corner-points of the polygon. The width of the polygon is the desired intended width. Then, the polygon is added into the original layout, overlapping with the bend portion.

According to the method for automatically enlarging a width of a bend portion in a preferred embodiment of the invention, the calculation to obtain a plurality of coordinates of the corner-points of the polygon includes following steps. First, one point at each of the circuits coupled to the two terminals of the bend portion is selected as a first determination point and a second determination point, respectively. According to the first determination point, the second determination point, the first turn point and the second turn point, a corresponding calculation formula is determined, to obtain each coordinate of the corner-points of the polygon.

According to the method for automatically enlarging a width of the bend portion in a preferred embodiment of the invention, wherein the bend portion of the electric circuit bend portion is a 45 degree bend portion. Therefore, the step of calculation and obtaining the coordinates of the corner-points of the polygon includes following equation to get a coordinate difference of delta:

$$\text{Delta} = [(0.707 W_{bend} - 0.499 W_{normal})/\text{RES} + 1] * \text{RES}.$$

$W_{bend}$ means the intended width, $W_{normal}$ means an original width, and the RES means a resolution of circuit layout.

In addition, the present invention provides a computer readable recording medium for storing program which is executable in computer system. The program can be used to enlarge the line width of the bend portion circuit line on the circuit layout from original width to intended width. The two terminals of the center line of the bend portion are a first turn point and a second turn point, respectively. The program includes following sets of instructions for reading out the layout, calculating the original width, the intended width, the coordinates of the first turn point and the second turn point, and obtaining a plurality coordinates of the corner-points of the polygon. The width of the bend portion is the intended width. And, the polygon is added into the original layout, and overlapping with the bend portion.

This invention can be used to calculate the original width, the intended width, the coordinates of the first turn point and the second turn point, and to obtain a plurality coordinates of the corner-points of the polygon. The width of the polygon is the intended width, the polygon is added into the original layout, overlapping with the bend portion. Therefore, this invention can enlarge the width of the bend portion automatically without manual operation, and improve efficiency of layout.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
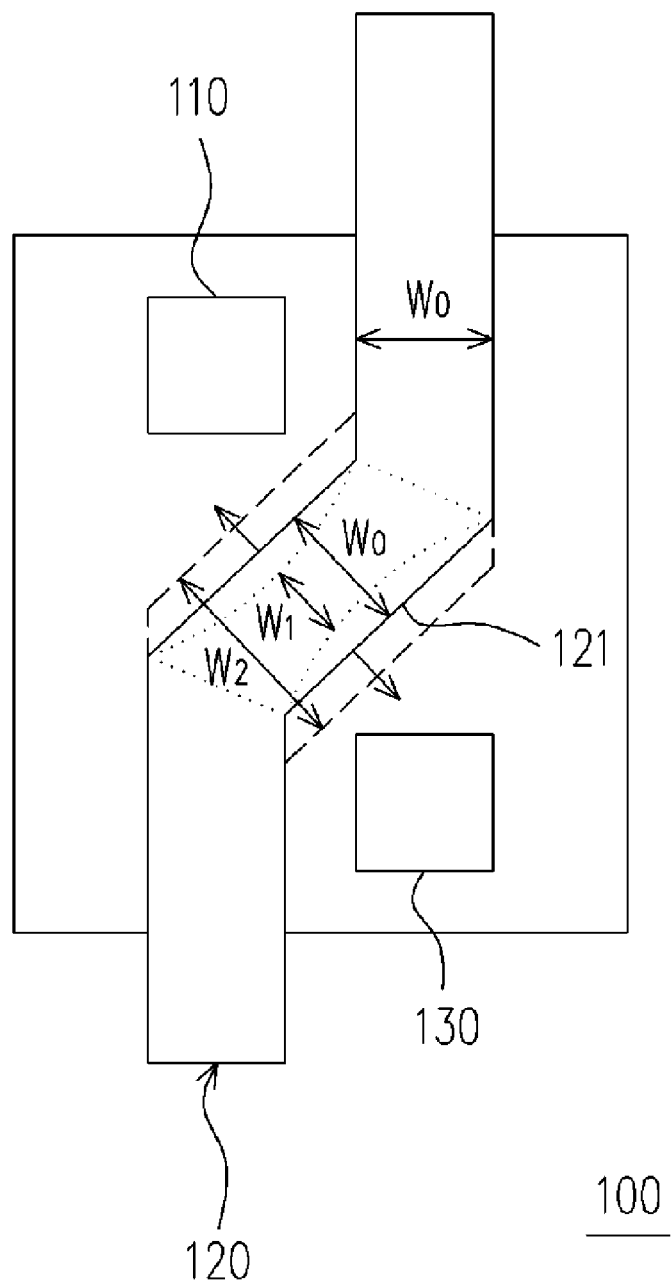
FIG. 1 is a top view, schematically illustrating the bend gate electrode of a conventional transistor.
Figure 2:
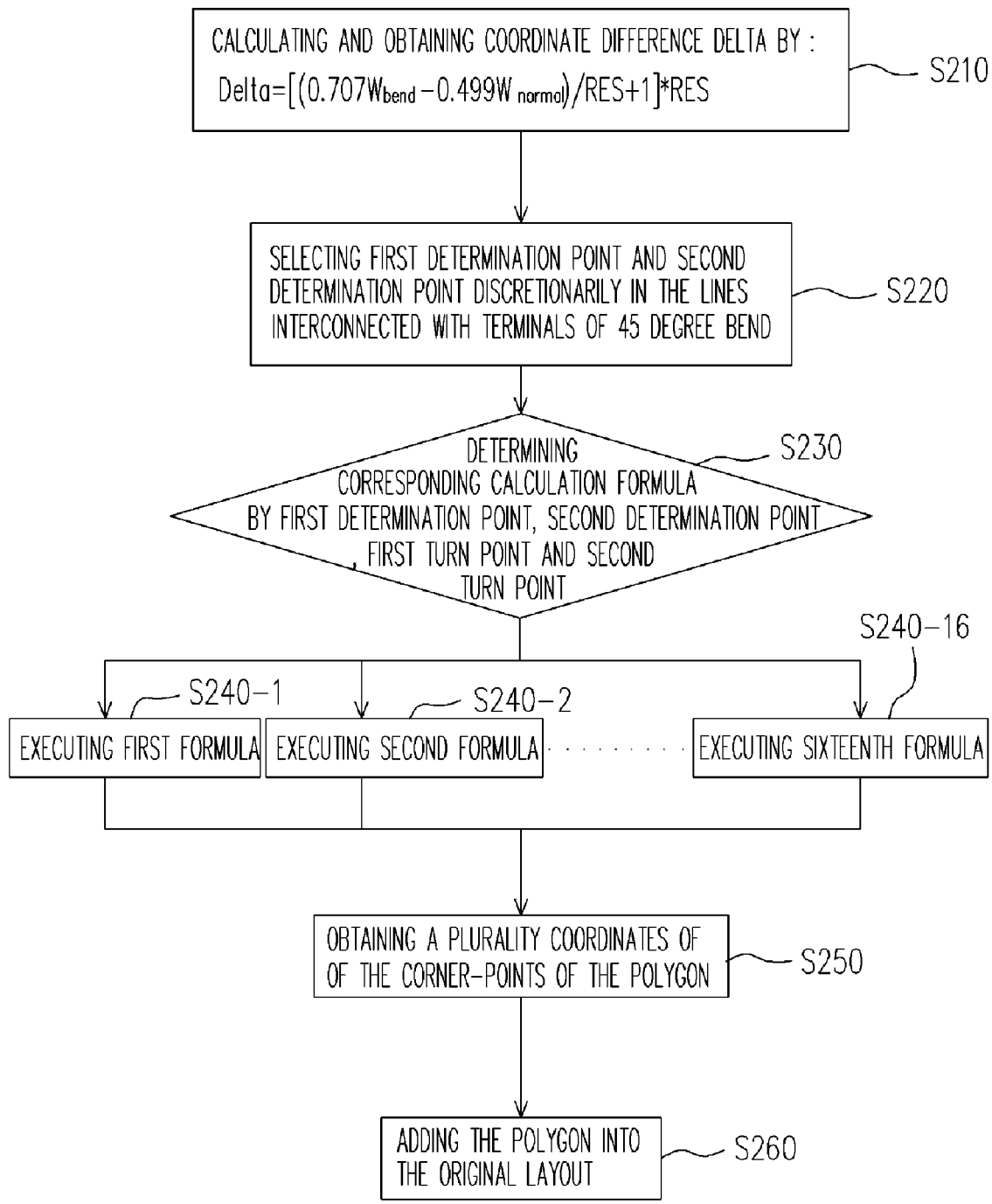
FIG. 2 is a process diagram, schematically illustrating the process of automatically enlarging a line width of the bend portion, according to a preferred embodiment of the invention.

FIG. 2 is a process diagram, schematically illustrating the process of automatically enlarging a line width of the bend portion, according to a preferred embodiment of the invention. Referring to FIG. 2, the method is used to enlarge circuit line bend portion width from original width to the intended width. In the embodiment, the circuit line can be the gate of transistor or the metal interconnection wire.

In order to easily describe the invention, an embodiment is taken to describe the method for auto-enlarging bend portion width in 45 degree bend. To those skilled in the ordinary art, the bend with any angle and the geometry shape can be extended according to the invention and the embodiment described below. In other words, the scope of this invention shall not be limited by following embodiments.

Figure 3:
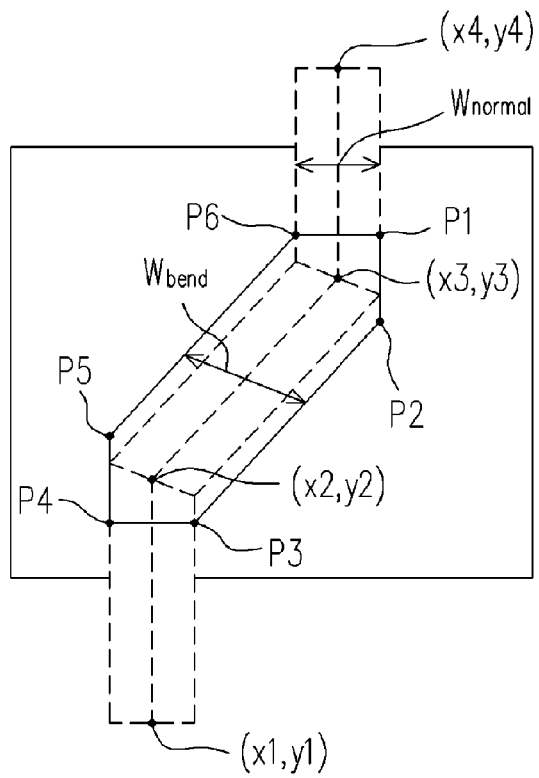
FIGS. 3-18 are drawings, schematically illustrating the overlapping between the bend portion of electric circuit and the polygon.

FIG. 3 shows the condition that 45 degree bend of circuit line overlaps the polygon in the embodiment of this invention. Referring to FIG. 2 and FIG. 3, the terminals of the center line of the 45 degree bend portion is a first turn point with coordinate (x2,y2) and a second turn point with coordinate (x3,y3), respectively. First, the step S210 to S250 is performed. a calculation is performed, according to the original width, the intended width, the coordinates of the first turn point and the second turn point to obtain a plurality coordinates of the corner-points of the polygon (for example, corner points P1 to P6 in FIG. 3), and the polygon width is the intended width. Then, the step S260 is performed by adding the polygon to the original layout, and overlapping with the 45 degree bend portion.

In step S210, coordinates difference delta is calculated by:

$$\text{Delta} = [(0.707 W_{bend} - 0.499 W_{normal})/\text{RES} + 1] * \text{RES}.$$

$W_{bend}$ means the intended width of the bend portion to be enlarged (usually, the intended width is determined according to design rule taken by the manufacturer), $W_{normal}$ means the original width, RES means the resolution of circuit layout. In aforesaid step S220, a first determination point and a second determination point are respectively set from any point in each of the circuits coupled to the terminals of the 45 degree bend portion. For example, coordinate (x1,y1) is selected as the first determination point in FIG. 3, and coordinate (x4,y4) is selected as the second determination point.

Considering that there are sixteen conditions for producing polygon with 45 degree bend portion, in step S230, a corresponding calculation formula is determined by the first determination point, the second determination point, the first turn point and the second turn point. Then, following the result of step S230, a calculation formula is selected (S240-1 to S240-16). Then, according to the selected calculation formula, each of the coordinates of the corner points of the polygon is obtained (step S250).

The foregoing 16 kinds of conditions for producing polygons with 45 degree bend are described below by referencing with FIG. 3 to FIG. 16. The coordinates of the first determination point, the first turn point, the second turn point and the second determination point are (x1,y1), (x2,y2),(x3,y3) and (x4,y4) respectively, and w means $W_{normal}/2$.

First Condition:

Referring to FIG. 2 and FIG. 3 simultaneously, when the determined results of the step S230 is x1=x2, y1<y2, x2<x3, y2<y3, x3=x4, y3<y4, step S240-1 is selected. Then, according to following formulas (first sets of formulas), the corner points P1-P6 of the polygon are respectively obtained:

$$P1 = (x3+w, y3+\text{delta});$$

$$P2 = (x3+w, y3-\text{delta});$$

$$P3 = (x2+w, y2-\text{delta});$$

$$P4 = (x2-w, y2-\text{delta});$$

$$P5 = (x2-w, y2+\text{delta});$$

$$P6 = (x3-w, y3+\text{delta}).$$

Figure 4:
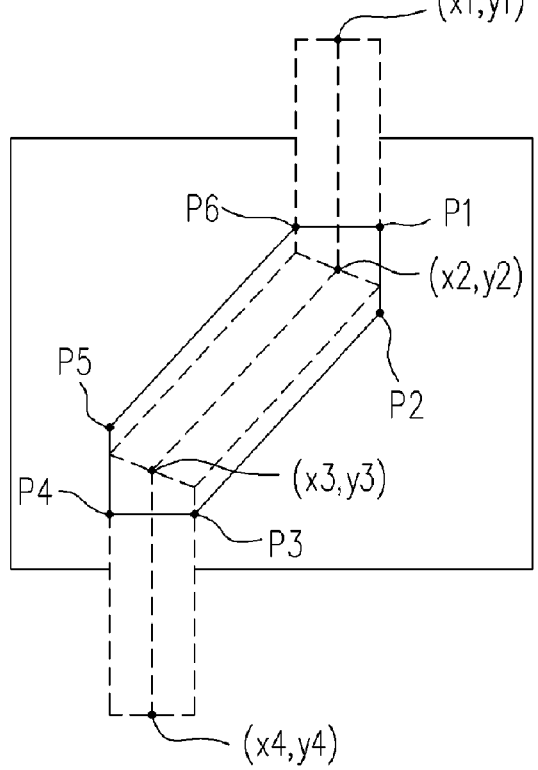

Second Condition:

Referring to FIG. 2 and FIG. 4 simultaneously, when the determined result of step S230 is x1=x2, y1>y2, x2>x3, y2>y3, x3=x4, y3>y4, step S240-2 is selected. Then, according to following formulas (second sets of formulas), the corner points P1-P6 of the polygon are respectively obtained:

$$P1 = (x2+w, y2+\text{delta});$$

$$P2 = (x2+w, y2-\text{delta});$$

$$P3 = (x3+w, y3-\text{delta});$$

$$P4 = (x3-w, y3-\text{delta});$$

$$P5 = (x3-w, y3+\text{delta});$$

$$P6 = (x2-w, y2+\text{delta}).$$

Figure 5:
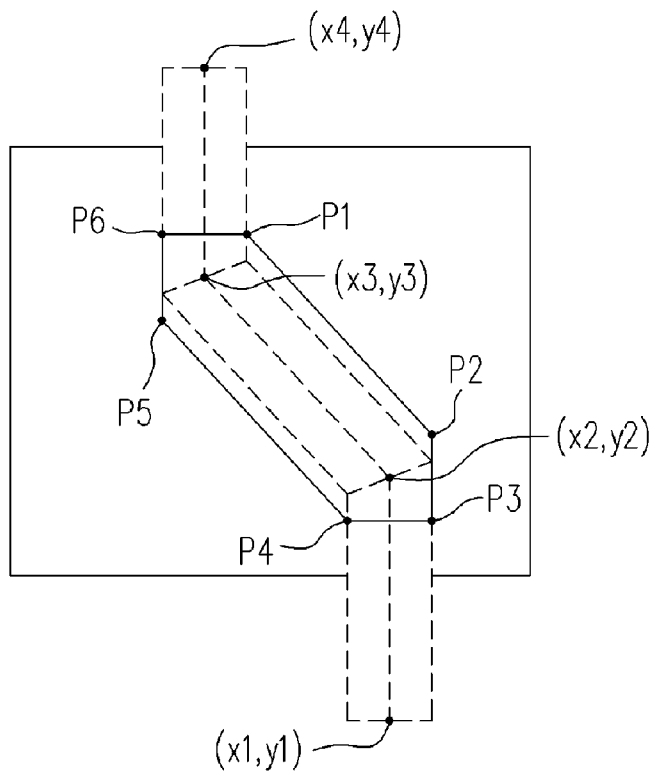

Third Condition:

Referring to FIG. 2 and FIG. 5 simultaneously, when the determined result of step S230 is x1=x2, y1<y2, x2>x3, y2<y3, x3=x4, y3<y4, the step S240-3 is selected. Then, according to following formulas (third sets of formulas), the corner points P1-P6 of the polygon are respectively obtained:

$$p1 = (x3+w, y3+\text{delta});$$

$$p2 = (x2+w, y2+\text{delta});$$

$$p3 = (x2+w, y2-\text{delta});$$

$$p4 = (x2-w, y2-\text{delta});$$

$$p5 = (x3-w, y3-\text{delta});$$

$$p6 = (x3-w, y3+\text{delta}).$$

Figure 6:
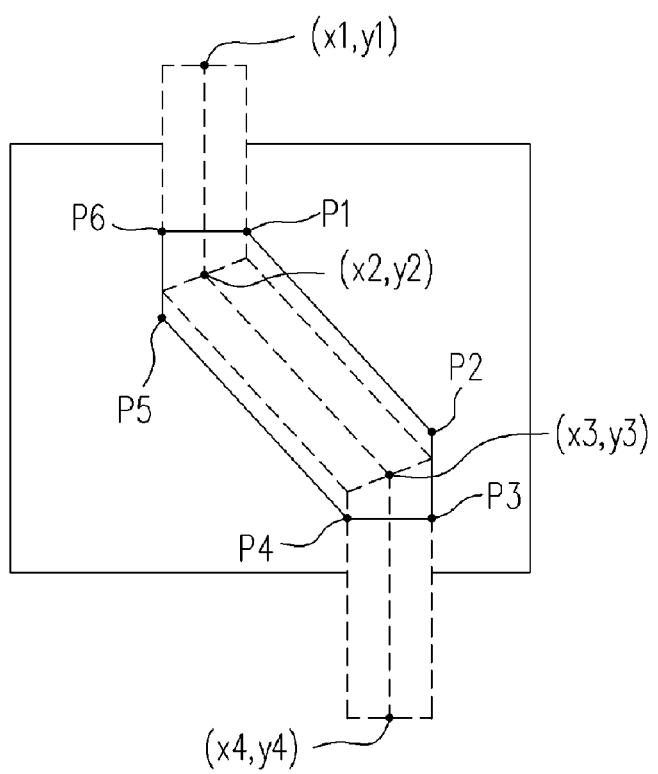

Fourth Condition:

Referring to FIG. 2 and FIG. 6 simultaneously, when the determined result of step S230 is x1=x2, y1>y2, x2<x3, y2>y3, x3=x4, y3>y4, the step S240-4 is selected. Then, according to following formulas (fourth sets of formulas), the corner points P1-P6 of the polygon are respectively obtained:

$$P1 = (x2+w, y2+\text{delta});$$

$$P2 = (x3+w, y3+\text{delta});$$

$P3=(x3+w, y3-\text{delta})$;

$P4=(x3-w, y3-\text{delta})$;

$P5=(x2-w, y2-\text{delta})$;

$P6=(x2-w, y2+\text{delta})$.

Figure 7:
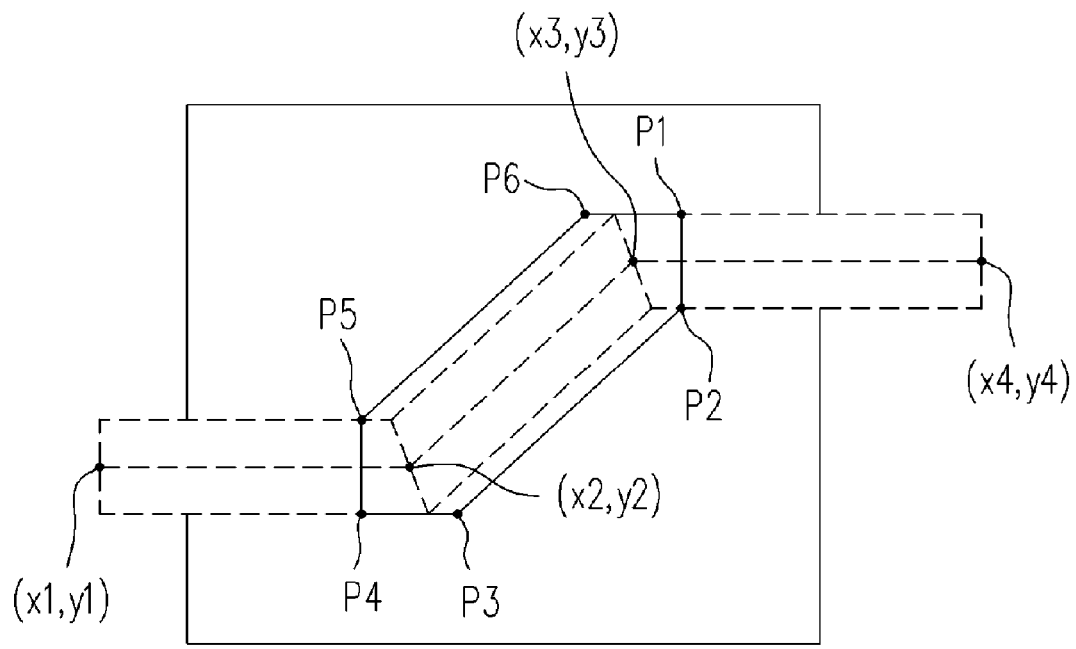

Fifth Condition:

Referring to FIG. 2 and FIG. 7 simultaneously, when the determined result of step S230 is x1<x2, y1=y2, x2<x3, y2<y3, x3<x4, y3=y4, the step S240-5 is selected. Then, according to following formulas (fifth sets of formulas), the corner points P1-P6 of the polygon are respectively obtained:

$P1=(x3+\text{delta}, y3+w)$;

$P2=(x3+\text{delta}, y3-w)$;

$P3=(x2+\text{delta}, y2-w)$;

$P4=(x2-\text{delta}, y2-w)$;

$P5=(x2-\text{delta}, y2+w)$;

$P6=(x3-\text{delta}, y3+w)$.

Figure 8:
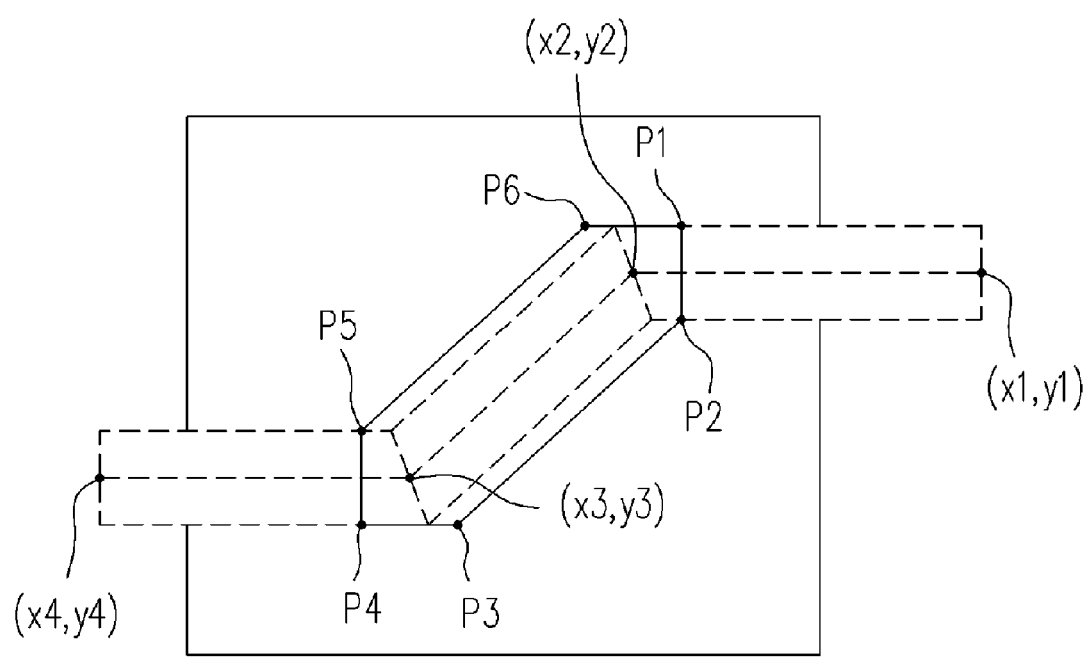

Sixth Condition:

Referring to FIG. 2 and FIG. 8 simultaneously, when the determined result of step S230 is x1>x2, y1=y2, x2>x3, y2>y3, x3>x4, y3=y4, the step S240-6 is selected. Then, according to following formulas (sixth sets of formulas), the corner points P1-P6 of the polygon are respectively obtained:

$P1=(x2+\text{delta}, y2+w)$;

$P2=(x2+\text{delta}, y2-w)$;

$P3=(x3+\text{delta}, y3-w)$;

$P4=(x3-\text{delta}, y3-w)$;

$P5=(x3-\text{delta}, y3+w)$;

$P6=(x2-\text{delta}, y2+w)$.

Figure 9:
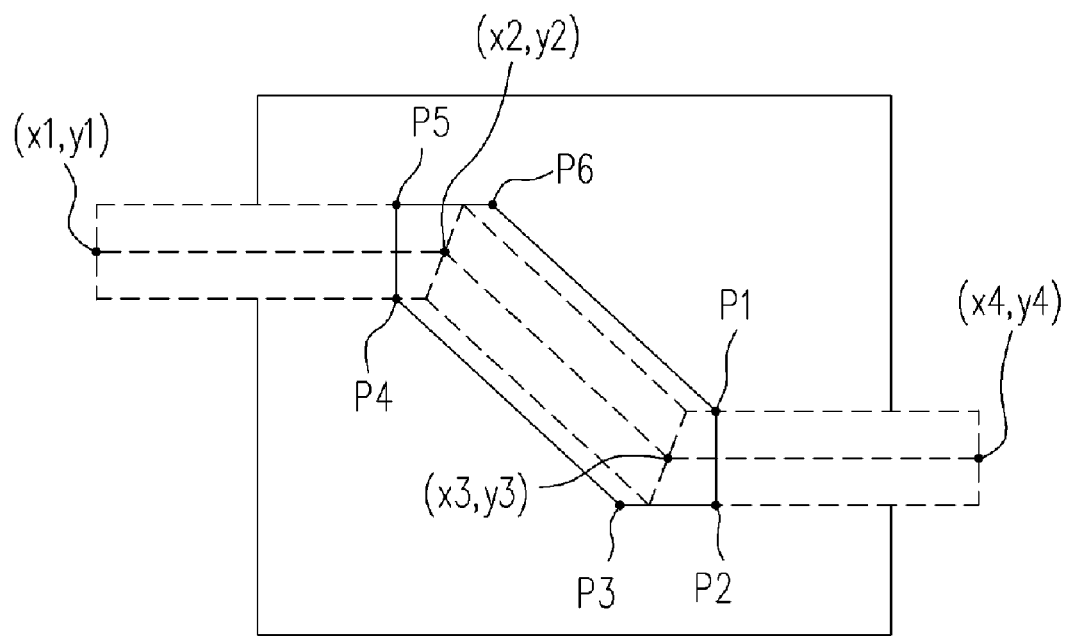

Seventh Condition:

Referring to FIG. 2 and FIG. 9 simultaneously, when the determined result of step S230 is x1<x2, y1=y2, x2<x3, y2>y3, x3<x4, y3=y4, the step S240-7 is selected. Then, according to following formulas (seventh sets of formulas), the corner points P1-P6 of the polygon are respectively obtained:

$P1=(x3+\text{delta}, y3+w)$;

$P2=(x3+\text{delta}, y3-w)$;

$P3=(x3-\text{delta}, y3-w)$;

$P4=(x2-\text{delta}, y2-w)$;

$P5=(x2-\text{delta}, y2+w)$;

$P6=(x2+\text{delta}, y2+w)$.

Figure 10:
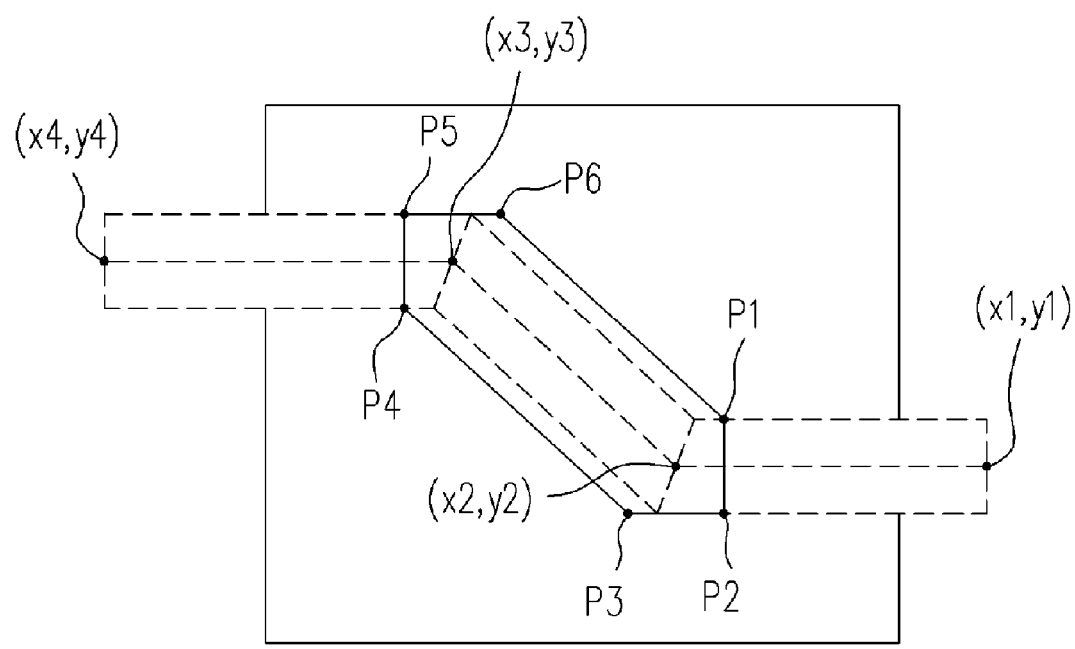

Eighth Condition:

Referring to FIG. 2 and FIG. 10 simultaneously, when the determined result of step S230 is x1>x2, y1=y2, x2>x3, y2<y3, x3>x4, y3=y4, the step S240-8 is selected. Then, according to following formulas (eighth sets of formulas), the corner points P1-P6 of the polygon are respectively obtained:

$P1=(x2+\text{delta}, y2+w)$;

$P2=(x2+\text{delta}, y2-w)$;

$P3=(x2-\text{delta}, y2-w)$;

$P4=(x3-\text{delta}, y3-w)$;

$P5=(x3-\text{delta}, y3+w)$;

$P6=(x3+\text{delta}, y3+w)$.

Figure 11:
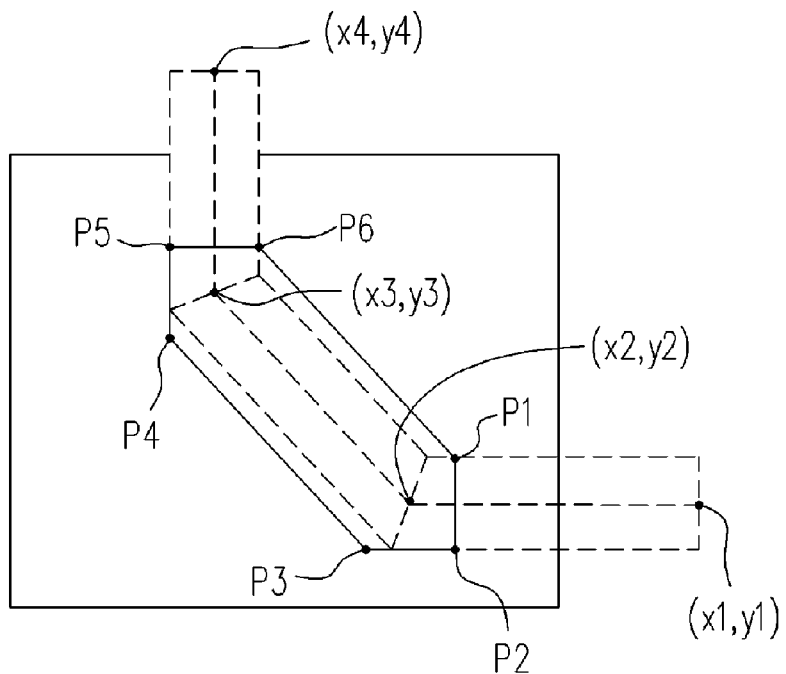

Ninth Condition:

Referring to FIG. 2 and FIG. 11 simultaneously, when the determined result of step S230 is x1>x2, y1=y2, x2>x3, y2<y3, x3=x4, y3<y4, the step S240-9 is selected. Then, according to following formulas (ninth sets of formulas), the corner points P1-P6 of the polygon are respectively obtained:

$P1=(x2+\text{delta}, y2+w)$;

$P2=(x2+\text{delta}, y2-w)$;

$P3=(x2-\text{delta}, y2-w)$;

$P4=(x3-w, y3-\text{delta})$;

$P5=(x3-w, y3+\text{delta})$;

$P6=(x3+w, y3+\text{delta})$.

Figure 12:
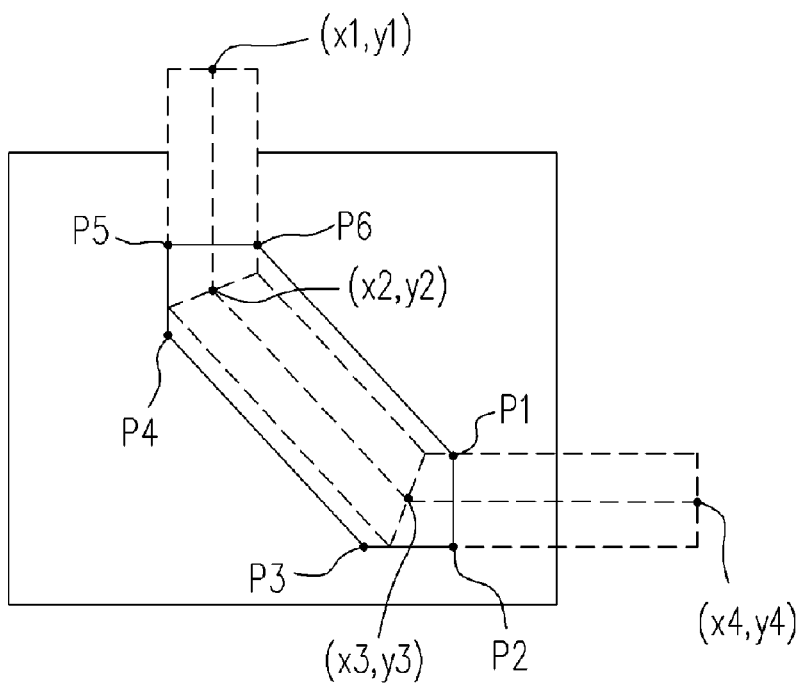

Tenth Condition:

Referring to FIG. 2 and FIG. 12 simultaneously, when the determined result of step S230 is x1=x2, y1>y2, x2<x3, y2>y3, x3<x4, y3=y4, the step S240-10 is selected. Then, according to following formulas (tenth sets of formulas), the corner points P1-P6 of the polygon are respectively obtained:

$P1=(x3+\text{delta}, y3+w)$;

$P2=(x3+\text{delta}, y3-w)$;

$P3=(x3-\text{delta}, y3-w)$;

$P4=(x2-w, y2-\text{delta})$;

$P5=(x2-w, y2+\text{delta})$;

$P6=(x2+w, y2+\text{delta})$.

Figure 13:
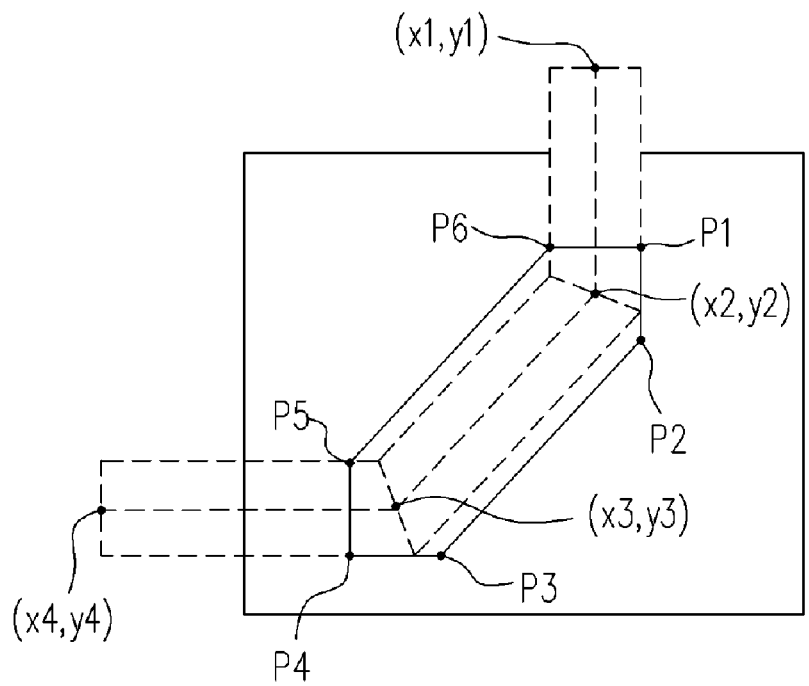

Eleventh Condition:

Referring to FIG. 2 and FIG. 13 simultaneously, while determination result of step S230 is x1=x2, y1>y2, x2>x3, y2>y3, x3>x4, y3=y4, the step S240-11 is selected. Then, according to following formulas (eleventh sets of formulas), the corner points P1-P6 of the polygon are respectively obtained:

$P1=(x2+w, y2+\text{delta})$;

$P2=(x2+w, y2-\text{delta})$;

$P3=(x3-\text{delta}, y3-w)$;

$P4=(x3-\text{delta}, y3-w)$;

$P5=(x3-\text{delta}, y3+w)$;

$P6=(x2-w, y2+\text{delta})$.

Figure 14:
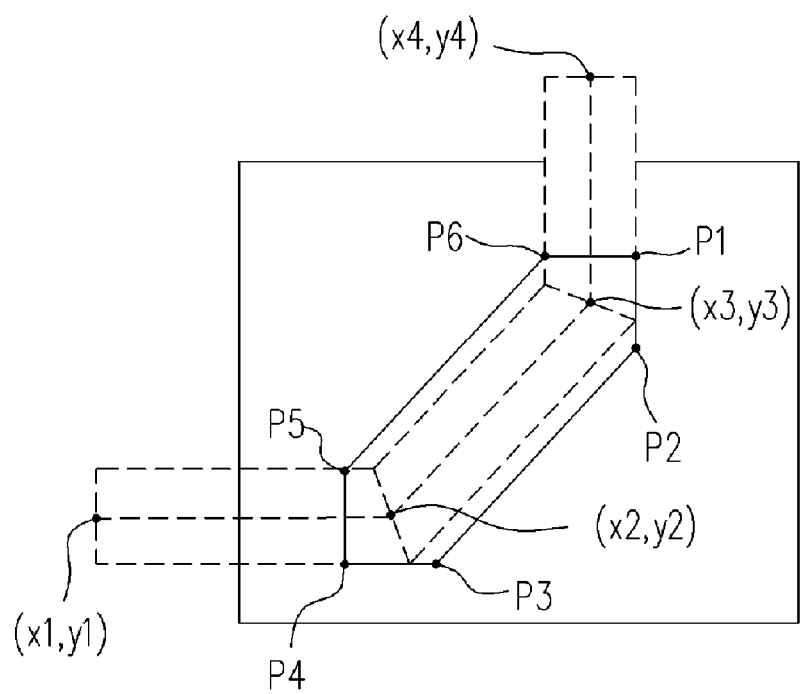

Twelfth Condition:

Referring to FIG. 2 and FIG. 14 simultaneously, when the determined result of step S230 is x1<x2, y1=y2, x2<x3, y2<y3, x3=x4, y3<y4, the step S240-12 is selected. Then, according to following formulas (twelfth sets of formulas), the corner points P1-P6 of the polygon are respectively obtained:

$P1=(x3+w, y3+delta)$;

$P2=(x3+w, y3-delta)$;

$P3=(x2+delta, y2-w)$;

$P4=(x2-delta, y2-w)$;

$P5=(x2-delta, y2+w)$;

$P6=(x3-w, y3+delta)$.

Figure 15:
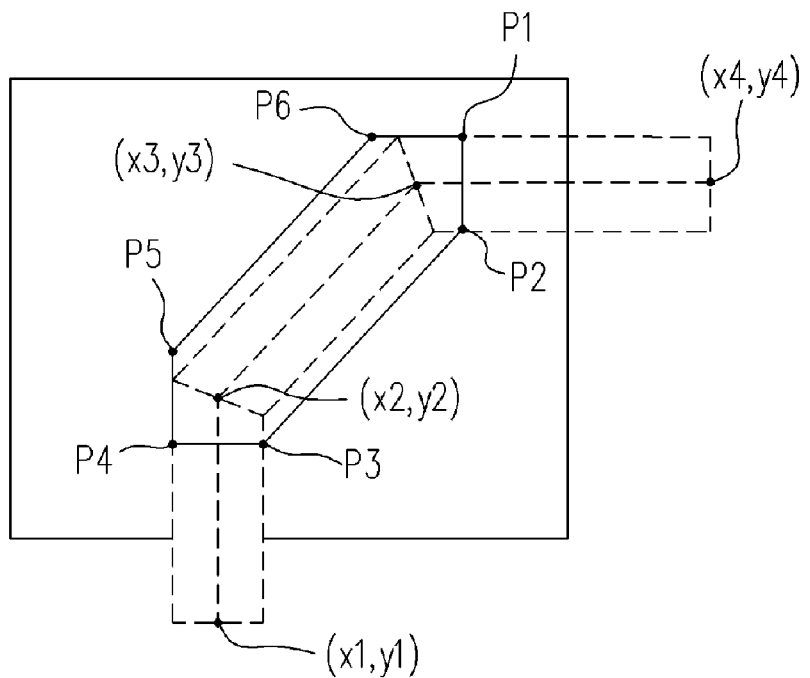

Thirteenth Condition:

Referring to FIG. 2 and FIG. 15 simultaneously, when the determined result of step S230 is x1=x2, y1<y2, x2<x3, y2<y3, x3<x4, y3=y4, the step S240-13 is selected. Then, according to following formulas (thirteenth sets of formulas), the corner points P1-P6 of the polygon are respectively obtained:

$P1=(x3+delta, y3+w)$;

$P2=(x3+delta, y3-w)$;

$P3=(x2+w, y2-delta)$;

$P4=(x2-w, y2-delta)$;

$P5=(x2-w, y2+delta)$;

$P6=(x3-delta, y3+w)$.

Fourteenth Condition

Figure 16:
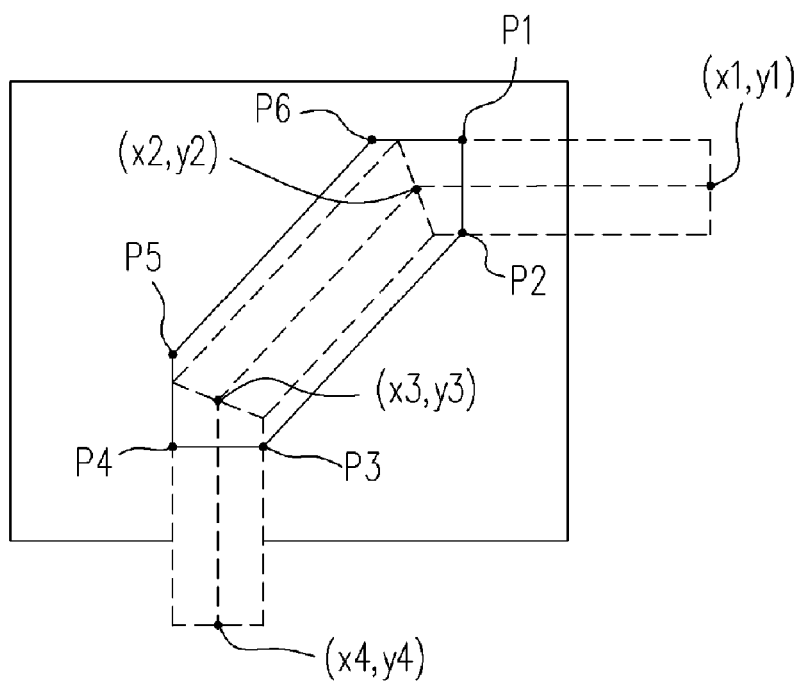

Referring to FIG. 2 and FIG. 16 simultaneously, when the determined result of step S230 is x1>x2, y1=y2, x2>x3, y2>y3, x3=x4, y3>y4, the step S240-14 is selected. Then, according to following formulas (fourteenth sets of formulas), the corner points P1-P6 of the polygon are respectively obtained:

$P1=(x2delta, y2+w)$;

$P2=(x2delta, y2-w)$;

$P3=(x3+w, y3-delta)$;

$P4=(x3-w, y3-delta)$;

$P5=(x3-w, y3+delta)$;

$P6=(x2delta, y2+w)$.

Figure 17:
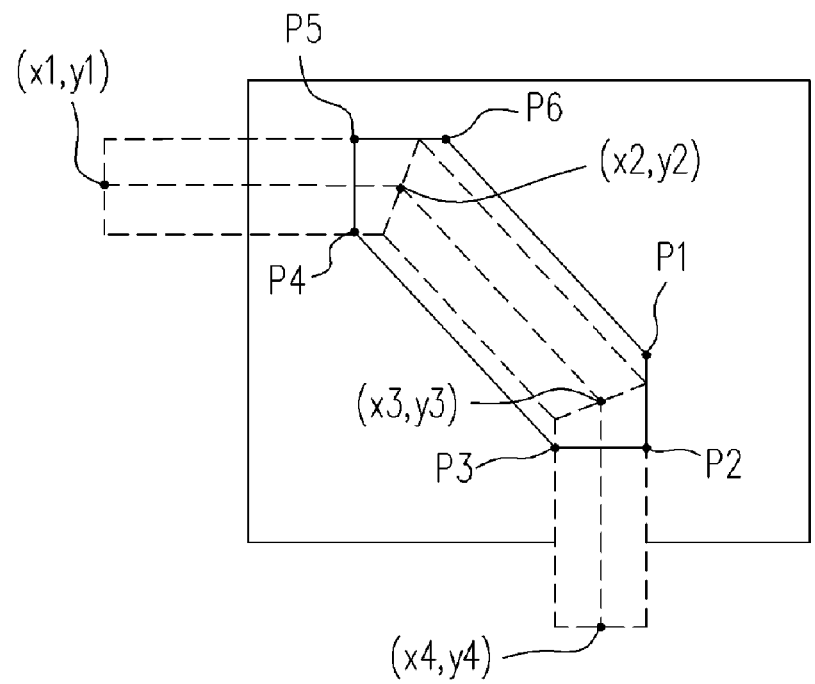

Fifteenth Condition:

Referring to FIG. 2 and FIG. 17 simultaneously, when the determined result of step S230 is x1<x2, y1=y2, x2<x3, y2>y3, x3=x4, y3>y4, the step S240-15 is selected. Then, according to following formulas (fifteenth sets of formulas), the corner points P1-P6 of the polygon are respectively obtained:

$P1=(x3+w, y3+delta)$;

$P2=(x3+w, y3-delta)$;

$P3=(x3-w, y3-delta)$;

$P4=(x2delta, y22-w)$;

$P5=(x2delta, y22+w)$;

$P6=(x2delta, y22+w)$.

Figure 18:
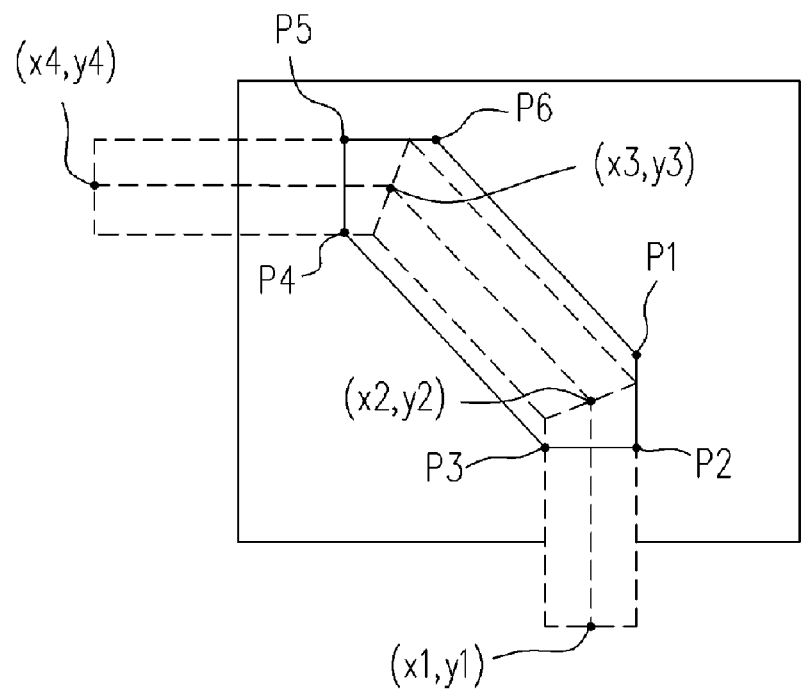

Sixteenth Condition:

Referring to FIG. 2 and FIG. 18 simultaneously, when the determined result of step S230 is x1=x2, y1<y2, x2>x3, y2<y3, x3>x4, y3=y4, the step S240-16 is selected. Then, according to following formulas (sixteenth sets of formulas), the corner points P1-P6 of the polygon are respectively obtained:

$P1=(x2+w, y2+delta)$;

$P2=(x2+w, y2-delta)$;

$P3=(x2-w, y2-delta)$;

$P4=(x3-delta, y3-w)$;

$P5=(x3-delta, y3+w)$;

$P6=(x3+delta, y3+w)$.

In conclusion, this invention can be used to calculate the original width, the intended width, the coordinates of the first turn point and the second turn point to obtain a plurality coordinates of the corner-points of the polygon, then adding the polygon into the original layout, overlapping with bend. Therefore, this invention can enlarge the width of the 45 degree bend portion automatically without manual operation, and improve efficiency of layout.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for automatically enlarging a width of a bend portion, for enlarging the width of the bend portion of a circuit line in a circuit layout from an original width to an intended width, wherein two terminals of a center line of the bend portion respectively are a first turn point and a second turn point of the circuit line, the method comprising:

performing a calculation based on the original width, the intended width, coordinates of the first turn point and the second turn point, to obtain a plurality of coordinates of corner-points of a polygon, wherein a width of the polygon is the intended width; and the step of performing the calculation comprises:

respectively selecting one point in each of two circuits coupled to the two terminals of the bend portion to respectively set as a first determination point or a second determination point, wherein the bend portion in the circuit layout is 45 degree bend portion; and determining a calculation formula and obtaining the coordinates of the corner-points of the polygon, according to the first determination point, the second determination point, the first turn point and the second turn point, wherein calculation and obtaining the coordinates of the corner-points of the polygon include following an equation to get a coordinate difference delta by $delta=[(0.707W_{bend}-0.499W_{normal})/RES+1]*RES,$ wherein $W_{bend}$ represents the intended width, $W_{normal}$ represents the original width, RES represents a resolution of the circuit layout, adding the polygon into the original layout, overlapping with the bend portion, wherein the polygon, the bend portion, and the whole circuit line are in the same layer.

2. The method as claimed in claim 1, wherein coordinates of the first determination point, the first turn point, the second turn point and the second determination point are (x1,y1), (x2,y2), (x3,y3) and (x4,y4) respectively, and the step of determining the calculation formula includes:

when x1=x2, y1<y2, x2<x3, y2<y3, x3=x4, y3<y4, calculating to obtain the coordinates of the corner-points P1, P2, P3, P4, P5 and P6 of the polygon respectively by following formulas:

$P1=(x3+w, y3+\text{delta})$;

$P2=(x3+w, y3-\text{delta})$;

$P3=(x2+w, y2-\text{delta})$;

$P4=(x2-w, y2-\text{delta})$;

$P5=(x2-w, y2+\text{delta})$; and $P6=(x3-w, y3+\text{delta})$;

wherein, w represents Wnormal/2.

3. The method as claimed in claim 1, wherein coordinates of the first determination point, the first turn point, the second turn point and the second determination point are (x1,y1), (x2,y2), (x3,y3) and (x4,y4) respectively, and the step of determining the calculation formula includes:

when x1=x2, y1>y2, x2>x3, y2>y3, x3=x4, y3>y4, calculating to obtain the coordinates of the corner-points P1, P2, P3, P4, P5 and P6 of the polygon respectively by following formulas:

$P1=(x2+w, y2+\text{delta})$;

$P2=(x2+w, y2-\text{delta})$;

$P3=(x3+w, y3-\text{delta})$;

$P4=(x3-w, y3-\text{delta})$;

$P5=(x3-w, y3+\text{delta})$; and $P6=(x2-w, y2+\text{delta})$;

wherein, w represents Wnormal/2.

4. The method as claimed in claim 1, wherein coordinates of the first determination point, the first turn point, the second turn point and the second determination point are (x1,y1), (x2,y2), (x3,y3) and (x4,y4) respectively, and the step of determining the calculation formula includes:

when x1=x2, y1<y2, x2>x3, y2<y3, x3=x4, y3<y4, calculating to obtain the coordinates of the corner points P1, P2, P3, P4, P5 and P6 of the polygon respectively by following formulas:

$P1=(x3+w, y3+\text{delta})$;

$P2=(x2+w, y2+\text{delta})$;

$P3=(x2+w, y2-\text{delta})$;

$P4=(x2-w, y2-\text{delta})$;

$P5=(x3-w, y3-\text{delta})$; and $P6=(x3-w, y3+\text{delta})$;

wherein, w represents Wnormal/2.

5. The method claimed in claim 1, wherein coordinates of the first determination point, the first turn point, the second turn point and the second determination point are (x1,y1), (x2,y2), (x3,y3) and (x4,y4) respectively, and the step of determining the calculation formula includes:

when x1=x2, y1>y2, x2<x3, y2>y3, x3=x4, y3>y4, calculating to obtain the coordinates of the corner points P1, P2, P3, P4, P5 and P6 of the polygon respectively by following formulas:

$P1=(x2+w, y2+\text{delta})$;

$P2=(x3+w, y3+\text{delta})$;

$P3=(x3+w, y3-\text{delta})$;

$P4=(x3-w, y3-\text{delta})$;

$P5=(x2-w, y2-\text{delta})$; and $P6=(x2-w, y2+\text{delta})$;

wherein w represents Wnormal/2.

6. The method claimed in claim 1, wherein coordinates of the first determination point, the first turn point, the second turn point and the second determination point are (x1,y1), (x2,y2), (x3,y3) and (x4,y4) respectively, and the step of determining the calculation formula includes:

when x1<x2, y1=y2, x2<x3, y2<y3, x3<x4, y3=y4, calculating to obtain the coordinates of the corner points P1, P2, P3, P4, P5 and P6 of the polygon respectively by following formulas:

$P1=(x3+\text{delta}, y3+w)$;

$P2=(x3+\text{delta}, y3-w)$;

$P3=(x2+\text{delta}, y2-w)$;

$P4=(x2-\text{delta}, y2-w)$;

$P5=(x2-\text{delta}, y2+w)$; and $P6=(x3-\text{delta}, y3+w)$;

wherein, w represents Wnormal/2.

7. The method as claimed in claim 1, wherein coordinates of the first determination point, the first turn point, the second turn point and the second determination point are (x1,y1), (x2,y2), (c3,y3) and (x4,y4) respectively, and the step of determining the calculation formula includes:

when x1>x2, y1=y2, x2>x3, y2>y3, x3>x4, y3=y4, calculating to obtain the coordinates of the corner points P1, P2, P3, P4, P5 and P6 of the polygon respectively by following formulas:

$P1=(x2+\text{delta}, y2+w)$;

$P2=(x2+\text{delta}, y2-w)$;

$P3=(x3+\text{delta}, y3-w)$;

$P4=(x3-\text{delta}, y3-w)$;

$P5=(x3-\text{delta}, y3+w)$; and $P6=(x2-\text{delta}, y2+w)$;

wherein, w represents Wnormal/2.

8. The method as claimed in claim 1, wherein coordinates of the first determination point, the first turn point, the second turn paint and the second determination point are (x1,y1), (x2,y2), (x3,y3) and (x4,y4) respectively, and the step of determining the calculation formula includes:

when x1<x2, y1=y2, x2<x3, y2>y3, x3<x4, y3=y4, calculating to obtain the coordinates of the corner-points P1, P2, P3, P4, P5 and P6 of the polygon respectively by following formulas:

$P1=(x3+\text{delta}, y3+w);$ $P2=(x3+\text{delta}, y3-w);$ $P3=(x3-\text{delta}, y3-w);$ $P4=(x2-\text{delta}, y2-w);$ $P5=(x2-\text{delta}, y2+w);$ and $P6=(x2+\text{delta}, y2+w);$ wherein, w represents Wnormal/2.

9. The method claimed in claim 1, wherein coordinates of the first determination point, the first turn point, the second turn point and the second determination point are (x1,y1), (x2,y2), (x3,y3) and (x4,y4) respectively, and the step of determining the calculation formula includes:

when x1>x2, y1=y2, x2>x3, y2<y3, x3>x4, y3=y4, calculating to obtain the coordinates of the corner points P1, P2, P3, P4, P5 and P6 of the polygon respectively by following formulas:

$P1=(x2+\text{delta}, y2+w);$ $P2=(x2+\text{delta}, y2-w);$ $P3=(x2-\text{delta}, y2-w);$ $P4=(x3-\text{delta}, y3-w);$ $P5=(x3-\text{delta}, y3+w);$ and $P6=(x3+\text{delta}, y3+w);$ wherein, w represents Wnormal/2.

10. The method as claimed in claim 1, wherein coordinates of the first determination point the first turn point, the second turn point and the second determination point are (x1,y1), (x2,y2), (x3,y3) and (x4,y4) respectively, and the step of determining the calculation formula includes:

when x1>x2, y1=y2, x2>x3, y2<y3, x3=x4, y3<y4, calculating to obtain the coordinates of the corner-points P1, P2, P3, P4, P5 and P6 of the polygon respectively by following formulas:

$P1=(x2+\text{delta}, y2+w);$ $P2=(x2+\text{delta}, y2-w);$ $P3=(x2-\text{delta}, y2-w);$ $P4=(x3-w, y3-\text{delta});$ $P5=(x3-w, y3+\text{delta});$ and $P6=(x3+w, y3+\text{delta});$ wherein, w represents Wnormal/2.

11. The method as claimed in claim 1, wherein coordinates of the first determination point, the first turn point, the second turn point and the second determination point are (x1,y1), (x2,y2), (x3,y3) and (x4,y4) respectively, and the step of determining the calculation formula includes:

when x1=x2, y1>y2, x2<x3, y2>y3, x3<x4, y3=y4, calculating to obtain the coordinates of the corner-points P1, P2, P3, P4, P5 and P6 of the polygon respectively by following formulas:

$P1=(x3+\text{delta}, y3+w);$ $P2=(x3+\text{delta}, y3-w);$ $P3=(x3-\text{delta}, y3-w);$ $P4=(x2-w, y2-\text{delta});$ $P5=(x2-w, y2+\text{delta});$ and $P6=(x2+w, y2+\text{delta});$ wherein, w represents Wnormal/2.

12. The method as claimed in claim 1, wherein coordinates of the first determination point, the first turn point, the second turn point and the second determination point are (x1,y1), (x2,y2), (x3,y3) and (x4,y4) respectively, and the step of determining the calculation formula includes:

when x1=x2, y1>y2, x2>x3, y2>y3, x3>x4, y3=y4, calculating to obtain the coordinates of the corner-points P1, P2, P3, P4, P5 and P6 of the polygon respectively by following formulas:

$P1=(x2+w, y2+\text{delta});$ $P2=(x2+w, y2-\text{delta});$ $P3=(x3+\text{delta}, y3-w);$ $P4=(x3-\text{delta}, y3-w);$ $P5=(x3-\text{delta}, y3+w);$ and $P6=(x2-w, y2+\text{delta});$ wherein, w represents Wnormal/2.

13. The method as claimed in claim 1, wherein coordinates of the first determination point, the first turn point, the second turn point and the second determination point are (x1,y1), (x2,y2), (x3,y3) and (x4,y4) respectively, and the step of determining the calculation formula includes:

when x1<x2, y1=y2, x2<x3, y2<y3, x3=x4, y3<y4, calculating to obtain the coordinates of the corner-points P1, P2, P3, P4, P5 and P6 of the polygon respectively by following formulas:

$P1=(x3+w, y3+\text{delta});$ $P2=(x3+w, y3-\text{delta});$ $P3=(x2+\text{delta}, y2-w);$ $P4=(x2-\text{delta}, y2-w);$ $P5=(x2-\text{delta}, y2+w);$ and $P6=(x3-w, y3+\text{delta});$ wherein, w represents Wnormal/2.

14. The method as claimed in claim 1, wherein coordinates of the first determination point, the first turn point, the second turn point and the second determination point are (x1,y1), (x2,y2), (x3,y3) and (x4,y4) respectively, and the step of determining the calculation formula includes:

when x1=x2, y1<y2, x2<x3, y2<y3, x3<x4, y3=y4, calculating to obtain the coordinates of the corner-points P1, P2, P3, P4, P5 and P6 of the polygon respectively by following formulas:

$P1=(x3+\text{delta}, y3+w)$;

$P2=(x3+\text{delta}, y3-w)$;

$P3=(x2+w, y2-\text{delta})$;

$P4=(x2-w, y2-\text{delta})$;

$P5=(x2-w, y2+\text{delta})$; and $P6=(x3-\text{delta}, y3+w)$;

wherein, w represents Wnormal/2.

15. The method as claimed in claim 1, wherein coordinates of the first determination point, the first turn point, the second turn point and the second determination point are (x1,y1), (x2,y2), (x3,y3) and (x4,y4) respectively, and the step of determining the calculation formula includes:

when x1>x2, y1=y2, x2>x3, y2>y3, x3=x4, y3>y4, calculating to obtain the coordinates of the corner-points P1, P2, P3, P4, P5 and P6 of the polygon respectively by following formulas:

$P1=(x2+\text{delta}, y2+w)$;

$P2=(x2+\text{delta}, y2-w)$;

$P3=(x3+w, y3-\text{delta})$;

$P4=(x3-w, y3-\text{delta})$;

$P5=(x3-w, y3+\text{delta})$; and $P6=(x2-\text{delta}, y2+w)$;

wherein, w represents Wnormal/2.

16. The method as claimed in claim 1, wherein coordinates of the first determination point, the first turn point, the second turn point and the second determination point are (x1,y1), (x2,y2), (x3,y3) and (x4,y4) respectively, and the step of determining the calculation formula includes:

when x1<x2, y1=y2, x2<x3, y2>y3, x3=x4, y3>y4, calculating to obtain the coordinates of the corner-points P1, P2, P3, P4, P5 and P6 of the polygon respectively by following formulas:

$P1=(x3+w, y3+\text{delta})$;

$P2=(x3+w, y3-\text{delta})$;

$P3=(x3-w, y3-\text{delta})$;

$P4=(x2-\text{delta}, y2-w)$;

$P5=(x2-\text{delta}, y2+w)$; and $P6=(x2+\text{delta}, y2+w)$;

wherein, w represents Wnormal/2.

17. The method for auto enlarging bend portion width as claimed in claim 1, wherein coordinates of the first determination point, the first turn point, the second turn point and the second determination point are (x1,y1), (x2,y2), (x3,y3) and (x4,y4) respectively, and the step of determining the calculation formula includes:

when x1=x2, y1<y2, x2>x3, y2<y3, x3>x4, y3=y4, calculating to obtain the coordinates of the corner-points P1, P2, P3, P4, P5 and P6 of the polygon respectively by following formulas:

$P1=(x2+w, y2+\text{delta})$;

$P2=(x2+w, y2-\text{delta})$;

$P3=(x2-w, y2-\text{delta})$;

$P4=(x3-\text{delta}, y3-w)$;

$P5=(x3-\text{delta}, y3+w)$; and $P6=(x3+\text{delta}, y3+w)$;

wherein, w represents Wnormal/2.

18. The method as claimed in claim 1, wherein the circuit layout includes a gate of a transistor.

19. A computer readable recording medium, for storing a program which is executable in computer system, and the program can be used to enlarge a width of a bend portion of a circuit line on a circuit layout from an original width to an intended width, wherein terminals of a center line of the bend portion are a first turn point and a second turn point, respectively, the program comprising sets of instruction for:

reading out the circuit layout;

calculating and obtaining a plurality of coordinates of corner-points of the polygon, based on the original width, the intended width, coordinates of the first turn point and the second turn point, wherein a width of the polygon is the intended width, and the instructions for calculating and obtaining the coordinates of the corner-points of the polygon includes:

selecting two points respectively from two circuits, coupled to two terminals of the bend portion, wherein the two points respectively are a first determination point and a second determination point, and the bend portion of the circuit layout is a 45 degree bend portion; and determining a corresponding calculation formula from the first determination point, the second determination point, the first turn point and the second turn point, and obtaining the coordinates of the corner-points of the polygon, wherein the instructions for calculating and obtaining the coordinates of the corner-points of the polygon include following an equation to get a coordinate difference delta by $$\text{delta}=[(0.707W_{bend}-0.499W_{normal})/\text{RES}+1]*\text{RES}$$

wherein $W_{bend}$ represents the intended width, $W_{normal}$ represents original width, RES represents resolution of circuit layout;

adding the polygon into the original circuit layout, overlapping with the bend portion, wherein the polygon, the bend portion, and the whole circuit line are in the same layer.

20. The computer readable recording medium as claimed in claim 19, wherein coordinates of the first determination point, the first turn point, the second turn point and the second determination point are (x1,y1), (x2,y2), (x3,y3) and (x4,y4) respectively, and the instruction for determining the calculation formula includes:

when x1=x2, y1<y2, x2<x3, y2<y3, x3=x4, y3<y4, calculating to obtain the coordinates of the corner-points P1, P2, P3, P4, P5 and P6 of the polygon respectively by following formulas:

$P1=(x3+w, y3+\text{delta})$;

$P2=(x3+w, y3-\text{delta})$;

$P3=(x2+w, y2-\text{delta})$;

$P4=(x2-w, y2-\text{delta})$;

$P5=(x2-w, y2+\text{delta})$; and $P6=(x3-w, y3+\text{delta})$;

wherein w represents Wnormal/2.

21. The computer readable recording medium as claimed in claim 19, wherein coordinates of the first determination point, the first turn point, the second turn point and the second determination point are (x1,y1), (x2,y2), (x3,y3) and (x4,y4) respectively, and the instruction for determining the calculation formula includes:

when x1=x2, y1>y2, x2>x3, y2>y3, x3=x4, y3>y4, calculating to obtain the coordinates of the corner-points P1, P2, P3, P4, P5 and P6 of the polygon respectively by following formulas:

$P1=(x2+w, y2+\text{delta})$;

$P2=(x2+w, y2-\text{delta})$;

$P3=(x3+w, y3-\text{delta})$;

$P4=(x3-w, y3-\text{delta})$;

$P5=(x3-w, y3+\text{delta})$; and $P6=(x2-w, y2+\text{delta})$;

wherein w represents Wnormal/2.

22. The computer readable recording medium as claimed in claim 19, wherein coordinates of the first determination point, the first turn point, the second turn point and the second determination point are (x1,y1), (x2,y2), (x3,y3) and (x4,y4) respectively, and the instruction for determining the calculation formula includes:

when x1=x2, y1<y2, x2>x3, y2<y3, x3=x4, y3<y4, calculating to obtain the coordinates of the corner-points P1, P2, P3, P4, P5 and P6 of the polygon respectively by following formulas:

$P1=(x3+w, y3+\text{delta})$;

$P2=(x2+w, y2+\text{delta})$;

$P3=(x2+w, y2-\text{delta})$;

$P4=(x2-w, y2-\text{delta})$;

$P5=(x3-w, y3-\text{delta})$; and $P6=(x3-w, y3+\text{delta})$;

wherein w represents Wnormal/2.

23. The computer readable recording medium as claimed in claim 19, wherein coordinates of the first determination point, the first turn point, the second turn point and the second determination point are (x1,y1), (x2,y2), (x3,y3) and (x4,y4) respectively, and the instruction for determining the calculation formula includes:

when x1=x2, y1>y2, x2<x3, y2>y3, x3=x4, y3>y4, calculating to obtain the coordinates of the corner-points P1, P2, P3, P4, P5 and P6 of the polygon respectively by following formulas:

$P1=(x2+w, y2+\text{delta})$;

$P2=(x3+w, y3+\text{delta})$;

$P3=(x3+w, y3-\text{delta})$;

$P4=(x3-w, y3-\text{delta})$;

$P5=(x2-w, y2-\text{delta})$; and $P6=(x2-w, y2+\text{delta})$;

wherein w represents Wnormal/2.

24. The computer readable recording medium as claimed in claim 19, wherein coordinates of the first determination point, the first turn point, the second turn point and the second determination point are (x1,y1), (x2,y2), (x3,y3) and (x4,y4) respectively, and the instruction for determining the calculation formula includes:

when x1<x2, y1=y2, x2<x3, y2<y3, x3<x4, y3=y4, calculating to obtain the coordinates of the corner-points P1, P2, P3, P4, P5 and P6 of the polygon respectively by following formulas:

$P1=(x3+\text{delta}, y3+w)$;

$P2=(x3+\text{delta}, y3-w)$;

$P3=(x2+\text{delta}, y2-w)$;

$P4=(x2-\text{delta}, y2-w)$;

$P5=(x2-\text{delta}, y2+w)$; and $P6=(x3-\text{delta}, y3+w)$;

wherein w represents Wnormal/2.

25. The computer readable recording medium as claimed in claim 19, wherein coordinates of the first determination point, the first turn point, the second turn point and the second determination point are (x1,y1), (x2,y2), (x3,y3) and (x4,y4) respectively, and the instruction for determining the calculation formula includes:

when x1>x2, y1=y2, x2>x3, y2>y3, x3>x4, y3=y4, calculating to obtain the coordinates of the corner-points P1, P2, P3, P4, P5 and P6 of the polygon respectively by following formulas:

$P1=(x2+\text{delta}, y2+w)$;

$P2=(x2+\text{delta}, y2-w)$;

$P3=(x3+\text{delta}, y3-w)$;

$P4=(x3-\text{delta}, y3-w)$;

$P5=(x3-\text{delta}, y3+w)$; and $P6=(x2-\text{delta}, y2+w)$;

wherein w represents Wnormal/2.

26. The computer readable recording medium as claimed in claim 19, wherein coordinates of the first determination point, the first turn point, the second turn point and the second determination point are (x1,y1), (x2,y2), (x3,y3) and (x4,y4) respectively, and the instruction for determining the calculation formula includes:

when x1<x2, y1=y2, x2<x3, y2>y3, x3<x4, y3=y4, calculating to obtain the coordinates of the corner-points P1, P2, P3, P4, P5 and P6 of the polygon respectively by following formulas:

$P1=(x3+\text{delta}, y3+w)$;

$P2=(x3+\text{delta}, y3-w)$;

$P3=(x3-\text{delta}, y3-w)$;

$P4=(x2-\text{delta}, y2-w)$;

P5=(x2−delta, y2+w); and

P6=(x2+delta, y2+w);

wherein w represents Wnormal/2.

27. The computer readable recording medium as claimed in claim 19, wherein coordinates of the first determination point, the first turn point, the second turn point and the second determination point are (x1,y1), (x2,y2),(x3,y3) and (x4,y4) respectively, and the instruction for determining the calculation formula includes:

when x1>x2, y1=y2, x2>x3, y2<y3, x3>x4, y3=y4, calculating to obtain the coordinates of the corner-points P1, P2, P3, P4, P5 and P6 of the polygon respectively by following formulas:

P1=(x2+delta, y2+w);

P2=(x2+delta, y2−w);

P3=(x2−delta, y2−w);

P4=(x3−delta, y3−w);

P5=(x3−delta, y3+w); and

P6=(x3+delta, y3+w);

wherein w represents Wnormal/2.

28. The computer readable recording medium as claimed in claim 19, wherein coordinates of the first determination point, the first turn point, the second turn point and the second determination point are (x1,y1), (x2,y2), (x3,y3) and (x4,y4) respectively, and the instruction for determining the calculation formula includes:

when x1>x2, y1=y2, x2>x3, y2<y3, x3=x4, y3<y4, calculating to obtain the coordinates of the corner-points P1, P2, P3, P4, P5 and P6 of the polygon respectively by following formulas:

P1=(x2+delta, y2+w);

P2=(x2+delta, y2−w);

P3=(x2−delta, y2−w);

P4=(x3−w, y3−delta);

P5=(x3−w, y3+delta); and

P6=(x3+w, y3+delta);

wherein w represents Wnormal/2.

29. The computer readable recording medium as claimed in claim 19, wherein coordinates of the first determination point, the first turn point, the second turn point and the second determination point are (x1,y1), (x2,y2), (x3,y3) and (x4,y4) respectively, and the instruction for determining the calculation formula includes:

when x1=x2, y1>y2, x2<x3, y2>y3, x3<x4, y3=y4, calculating to obtain the coordinates of the corner-points P1, P2, P3, P4, P5 and P6 of the polygon respectively by following formulas:

P1=(x3+delta, y3+w);

P2=(x3+delta, y3−w);

P3=(x3−delta, y3−w);

P4=(x2−w, y2−delta);

P5=(x2−w, y2+delta); and

P6=(x2+w, y2+delta);

wherein w represents Wnormal/2.

30. The computer readable recording medium as claimed in claim 19, wherein coordinates of the first determination point, the first turn point, the second turn point and the second determination point are (x1,y1), (x2,y2), (x3,y3) and (x4,y4) respectively, and the instruction for determining the calculation formula includes:

when x1=x2, y1>y2, x2>x3, y2>y3, x3>x4, y3=y4, calculating to obtain the coordinates of the corner-points P1, P2, P3, P4, P5 and P6 of the polygon respectively by following formulas:

P1=(x2+w, y2+delta);

P2=(x2+w, y2−delta);

P3=(x3+delta, y3−w);

P4=(x3−delta, y3−w);

P5=(x3−delta, y3+w); and

P6=(x2−w, y2+delta);

wherein w represents Wnormal/2.

31. The computer readable recording medium as claimed in claim 19, wherein coordinates of the first determination point, the first turn point, the second turn point and the second determination point are (x1,y1), (x2,y2), (x3,y3) and (x4,y4) respectively, and the instruction for determining the calculation formula includes:

when x1<x2, y1=y2, x2<x3, y2<y3, x3=x4, y3<y4, calculating to obtain the coordinates of the corner-points P1, P2, P3, P4, P5 and P6 of the polygon respectively by following formulas:

P1=(x3+w, y3+delta);

P2=(x3+w, y3−delta);

P3=(x2+delta, y2−w);

P4=(x2−delta, y2−w);

P5=(x2−delta, y2+w); and

P6=(x3−w, y3+delta);

wherein w represents Wnormal/2.

32. The computer readable recording medium as claimed in claim 19, wherein coordinates of the first determination point, the first turn point, the second turn point and the second determination point are (x1,y1), (x2,y2), (x3,y3) and (x4,y4) respectively, and the instruction for determining the calculation formula includes:

when x1=x2, y1<y2, x2<x3, y2<y3, x3<x4, y3=y4, calculating to obtain the coordinates of the corner-points P1, P2, P3, P4, P5 and P6 of the polygon respectively by following formulas:

P1=(x3+delta, y3+w);

P2=(x3+delta, y3−w);

P3=(x2+w, y2−delta);

P4=(x2−w, y2−delta);

$P5=(x2-w, y2+\text{delta})$; and $P6=(x3-\text{delta}, y3+w)$;

wherein w represents Wnormal/2.

33. The computer readable recording medium as claimed in claim 19, wherein coordinates of the first determination point, the first turn point, the second turn point and the second determination point are (x1,y1), (x2,y2), (x3,y3) and (x4,y4) respectively, and the instruction for determining the calculation formula includes:

when x1>x2, y1=y2, x2>x3, y2>y3, x3=x4, y3>y4, calculating to obtain the coordinates of the corner-points P1, P2, P3, P4, P5 and P6 of the polygon respectively by following formulas:

$P1=(x2+\text{delta}, y2+w)$;

$P2=(x2+\text{delta}, y2-w)$;

$P3=(x3+w, y3-\text{delta})$;

$P4=(x3-w, y3-\text{delta})$;

$P5=(x3-w, y3+\text{delta})$; and $P6=(x2-\text{delta}, y2+w)$;

wherein w represents Wnormal/2.

34. The computer readable recording medium as claimed in claim 19, wherein coordinates of the first determination point, the first turn point, the second turn point and the second determination point are (x1,y1), (x2,y2),(x3,y3) and (x4,y4) respectively, and the instruction for determining the calculation formula includes:

when x1<x2, y1=y2, x2<x3, y2>y3, x3=x4, y3>y4, calculating to obtain the coordinates of the corner-points P1, P2, P3, P4, P5 and P6 of the polygon respectively by following formulas:

$P1=(x3+w, y3+\text{delta})$;

$P2=(x3+w, y3-\text{delta})$;

$P3=(x3-w, y3-\text{delta})$;

$P4=(x2-\text{delta}, y2-w)$;

$P5=(x2-\text{delta}, y2+w)$; and $P6=(x2+\text{delta}, y2+w)$;

wherein w represents Wnormal/2.

35. The computer readable recording medium as claimed in claim 19, wherein coordinates of the first determination point, the first turn point, the second turn point and the second determination point are (x1,y1), (x2,y2), (x3,y3) and (x4,y4) respectively, and the instruction for determining the calculation formula includes:

when x1=x2, y1<y2, x2>x3, y2<y3, x3>x4, y3=y4, calculating to obtain the coordinates of the corner-points P1, P2, P3, P4, P5 and P6 of the polygon respectively by following formulas:

$P1=(x2+w, y2+\text{delta})$;

$P2=(x2+w, y2-\text{delta})$;

$P3=(x2-w, y2-\text{delta})$;

$P4=(x3-\text{delta}, y3-w)$;

$P5=(x3-\text{delta}, y3+w)$; and $P6=(x3+\text{delta}, y3+w)$;

wherein w represents Wnormal/2.

36. The computer readable recording medium as claimed in claim 19, wherein the circuit line is a gate of the transistor.

* * * * *